United States Patent
Miura et al.

(10) Patent No.: US 9,453,889 B2
(45) Date of Patent: Sep. 27, 2016

(54) MAGNETIC SENSOR DEVICE

(71) Applicant: Seiko Instruments Inc., Chiba-shi, Chiba (JP)

(72) Inventors: Takemasa Miura, Chiba (JP); Minoru Ariyama, Chiba (JP); Tomoki Hikichi, Chiba (JP); Kentaro Fukai, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 14/741,976

(22) Filed: Jun. 17, 2015

(65) Prior Publication Data
US 2015/0377983 A1 Dec. 31, 2015

(30) Foreign Application Priority Data

Jun. 26, 2014 (JP) ................. 2014-131810
Mar. 19, 2015 (JP) ................. 2015-056464

(51) Int. Cl.
*G01R 33/00* (2006.01)
*G01R 33/02* (2006.01)
*G01R 33/06* (2006.01)
*G01R 33/07* (2006.01)
*G01R 1/30* (2006.01)

(52) U.S. Cl.
CPC ........... *G01R 33/0041* (2013.01); *G01R 33/07* (2013.01)

(58) Field of Classification Search
CPC ...... G01R 33/00; G01R 33/02; G01R 33/06; G01R 33/07; G01R 1/30
USPC .......... 324/225, 244, 251–252, 117 R, 123 R
See application file for complete search history.

(56) References Cited

FOREIGN PATENT DOCUMENTS

JP 2006-153699 A 6/2006

*Primary Examiner* — Tung X Nguyen
*Assistant Examiner* — Neel Shah
(74) *Attorney, Agent, or Firm* — Brinks Gilson & Lione

(57) ABSTRACT

To provide a magnetic sensor device which maintains accuracy thereof while reducing current consumption by switching drive power of a Hall element to two drive power. A magnetic sensor device is equipped with a driving circuit which supplies power to a sensor element, a switch change-over circuit which restricts the supply of the power from the driving circuit to the sensor element, a differential amplifier circuit which performs arithmetic processing on an output signal of the sensor element, a threshold voltage generating circuit which generates a threshold voltage used in magnetism determination, a comparison circuit which compares and determines a voltage of the differential amplifier circuit and the threshold voltage, and a logic circuit which according to the output of the comparison circuit, switches the power outputted from the driving circuit, switches the threshold voltage and controls on/off of the switch change-over circuit in a constant cycle.

6 Claims, 8 Drawing Sheets

MAGNETIC SENSOR DEVICE

RELATED APPLICATIONS

This application claims priority under 35 U.S.C. §119 to Japanese Patent Application Nos. 2014-131810 filed on Jun. 26, 2014 and 2015-056464 filed on Mar. 19, 2015, the entire content of which are hereby incorporated by reference.

BACKGROUND OF THE INVENTION

1. Field of the Invention

The present invention relates to a magnetic sensor device which converts a magnetic field intensity to an electric signal, and to a magnetic sensor device capable of attaining low power consumption while improving the accuracy of detecting a magnetic field.

2. Background Art

FIG. 7 is a circuit diagram of a related art magnetic sensor device. The related art magnetic sensor device is equipped with a magnetic sensor circuit 710, a CLK circuit 108, an ONOFF control circuit 730, and an output terminal 103. The magnetic sensor circuit 710 is equipped with a sensor element 104, a differential amplifier circuit 105, a comparison circuit 106, a latch circuit 704, and an NMOS transistor 705.

FIG. 8 is a timing chart illustrating the operation of the related art magnetic sensor device. The CLK circuit 108 outputs a clock signal of such a certain cycle Tclk as illustrated in FIG. 8. The ONOFF control circuit 730 generates a control signal having a cycle Tcycle from the clock signal and outputs it therefrom. The magnetic sensor circuit 710 performs an intermittent operation in a timing at which the control signal becomes H to realize low current consumption.

The sensor element 104 outputs a Hall voltage according to a magnetic field or a magnetic flux density. The differential amplifier circuit 105 amplifies the Hall voltage, and the comparison circuit 106 outputs a detection/non-detection signal by comparing the Hall voltage and a certain voltage. The latch circuit 704 holds the detection/non-detection signal even during an off period of the intermittent operation. The NMOS transistor 705 is controlled in on/off by the output signal of the latch circuit 704, which is inputted to a gate thereof. The output terminal 103 is connected with a pull-up resistor to thereby output an H/L signal corresponding to the presence or absence of the magnetic field or magnetic flux density, whereby the magnetic sensor circuit 710 of low current consumption is realized (refer to, for example, Patent Document 1, FIG. 2).

[Patent Document 1] Japanese Patent Application Laid-Open No. 2006-153699

SUMMARY OF THE INVENTION

The related art magnetic sensor device was however accompanied by a problem that when power consumption was further reduced after the execution of the intermittent operation, it was difficult to maintain the accuracy of the magnetic sensor device.

The present invention has been invented to solve the foregoing problem and provides a magnetic sensor device which maintains accuracy thereof while reducing current consumption by switching drive power of a Hall element to two drive power.

To solve the related art problem, a magnetic sensor device of the present invention is configured as follows:

There is provided a magnetic sensor device which provides a logic output according to the intensity of a magnetic field applied to a sensor element and which is equipped with a driving circuit which supplies power to the sensor element, a switch changeover circuit which restricts the supply of the power from the driving circuit to the sensor element, a differential amplifier circuit which performs arithmetic processing on an output signal of the sensor element, a threshold voltage generating circuit which generates a threshold voltage corresponding to a predetermined intensity of applied magnetic field, which is used in magnetism determination, a comparison circuit which compares and determines the relationship of magnitude between a voltage of the differential amplifier circuit and the threshold voltage generated by the threshold voltage generating circuit, and a logic circuit which outputs a first signal for the driving circuit to change the power supplied to the sensor element according to the output of the comparison circuit, a second signal to switch the threshold voltage of the threshold voltage generating circuit according to the output of the comparison circuit, and a third signal to control on/off of the switch changeover circuit in a constant cycle.

A magnetic sensor device of the present invention is capable of by switching drive power of a Hall element, reducing current consumption when a magnetic field is smaller than a magnetic field desired to detect, and improving the accuracy of detecting a magnetic field by the Hall element only when the magnetic field is close to the magnetic field desired to detect, thereby enhancing the accuracy of the magnetic sensor device.

DESCRIPTION OF THE PREFERRED EMBODIMENTS

An embodiment of the present invention will hereinafter be described with reference to the accompanying drawings.

Figure 1:
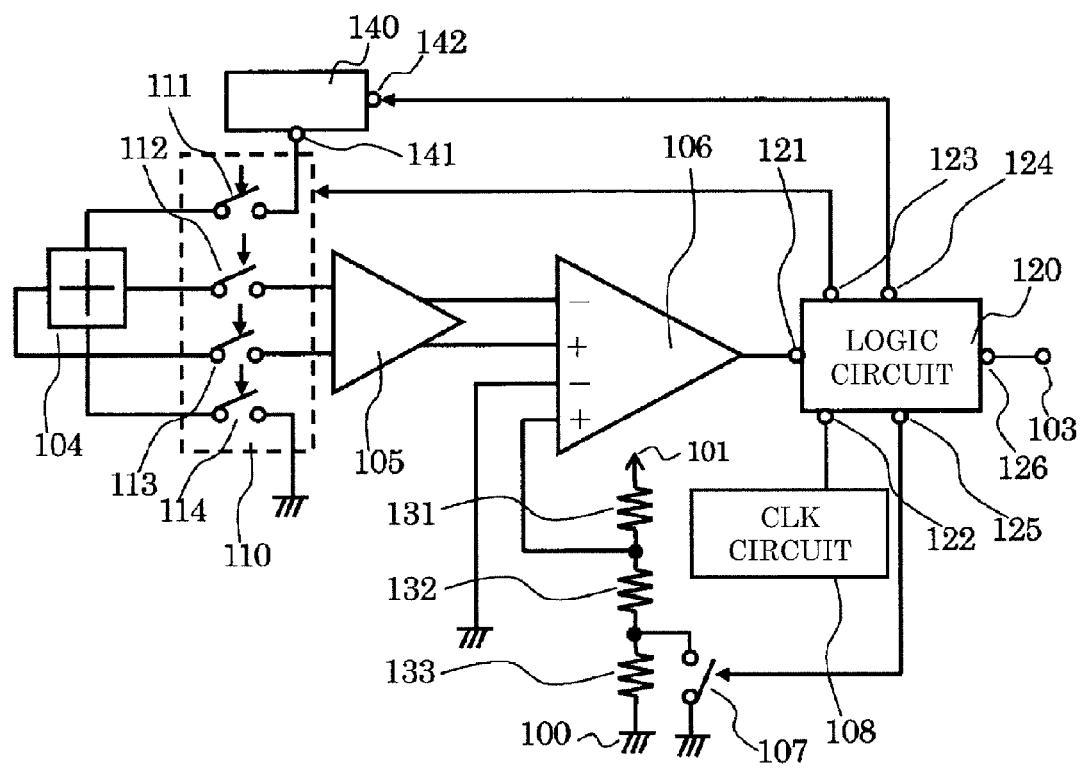
FIG. 1 is a circuit diagram of a magnetic sensor device of the present embodiment.

FIG. 1 is a circuit diagram of a magnetic sensor device of the present embodiment. The magnetic sensor device of the present embodiment is equipped with a Hall element 104, a switch changeover circuit 110, a differential amplifier circuit 105, a comparison circuit 106, a CLK circuit 108, a logic circuit 120, a driving circuit 140, resistors 131, 132, and 133, a switch circuit 107, a power supply terminal 101, a ground terminal 100, and an output terminal 103.

Figure 2:
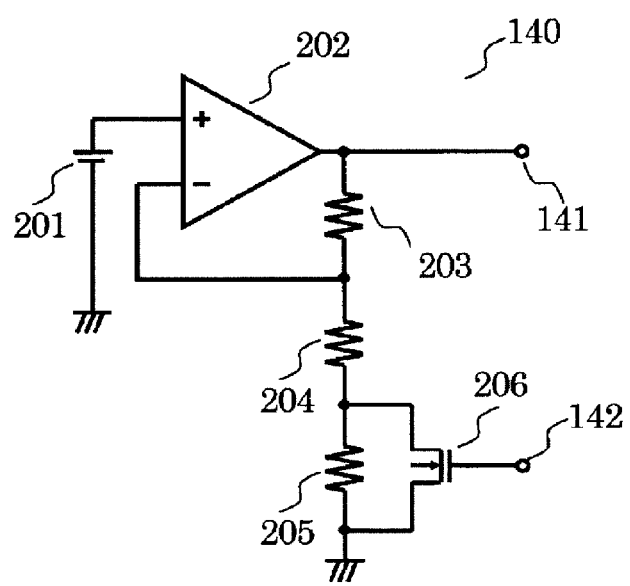
FIG. 2 is a circuit diagram illustrating one example of a driving circuit of the magnetic sensor device of the present embodiment.

The switch changeover circuit 110 is equipped with switch circuits 111, 112, 113, and 114. The logic circuit 120 is equipped with input terminals 121 and 122, and output terminals 123, 124, 125, and 126. FIG. 2 is a circuit diagram illustrating one example of the driving circuit 140. The driving circuit 140 is equipped with a reference voltage circuit 201, an amplifier 202, resistors 203, 204, and 205, an NMOS transistor 206, an input terminal 142, and an output terminal 141.

The Hall element 104 has an input terminal connected to one terminal of the switch circuit 111, a first output terminal connected to one terminal of the switch circuit 112, a second output terminal connected to one terminal of the switch circuit 113, and a third output terminal connected to one terminal of the switch circuit 114. The switch circuit 112 has the other terminal connected to a first input terminal of the differential amplifier circuit 105. The switch circuit 113 has the other terminal connected to a second input terminal of the differential amplifier circuit 105. The switch circuit 111 has the other terminal connected to an output terminal 141 of the driving circuit 140. The switch circuit 114 has the other terminal connected to the ground terminal 100. The differential amplifier circuit 105 has a first output connected to a first inversion input terminal of the comparison circuit 106, and a second output connected to a first non-inversion input terminal of the comparison circuit 106. The comparison circuit 106 has a second inversion input terminal connected to the ground terminal 100, a second non-inversion input terminal connected to a connecting point of the resistors 131 and 132, and an output connected to the input terminal 121 of the logic circuit 120. The resistor 131 has the other terminal connected to the power supply terminal 101. The resistor 132 has the other terminal connected to one terminal of the resistor 133 and one terminal of the switch circuit 107. The other terminal of the resistor 133 and the other terminal of the switch circuit 107 are connected to the ground terminal 100. In the logic circuit 120, the input terminal 122 is connected to the CLK circuit 108, the output terminal 123 is connected to the switch changeover circuit 110, the output terminal 124 is connected to the input terminal 142 of the driving circuit 140, the output terminal 125 is connected to the switch circuit 107, and the output terminal 126 is connected to the output terminal 103.

A description will be made about the connections of the driving circuit 140. The amplifier 202 has a non-inversion input terminal connected to a positive electrode of the reference voltage circuit 201, an inversion input terminal connected to a connecting point of the resistors 203 and 204, and an output connected to the other terminal of the resistor 203 and the output terminal 141. The reference voltage circuit 201 has a negative electrode connected to the ground terminal 100. The resistor 204 has the other terminal connected to one terminal of the resistor 205 and a drain of the NMOS transistor 206. The resistor 205 has the other terminal connected to the ground terminal 100. The NMOS transistor 206 has a gate connected to the input terminal 142, and a source connected to the ground terminal 100.

Figure 3:
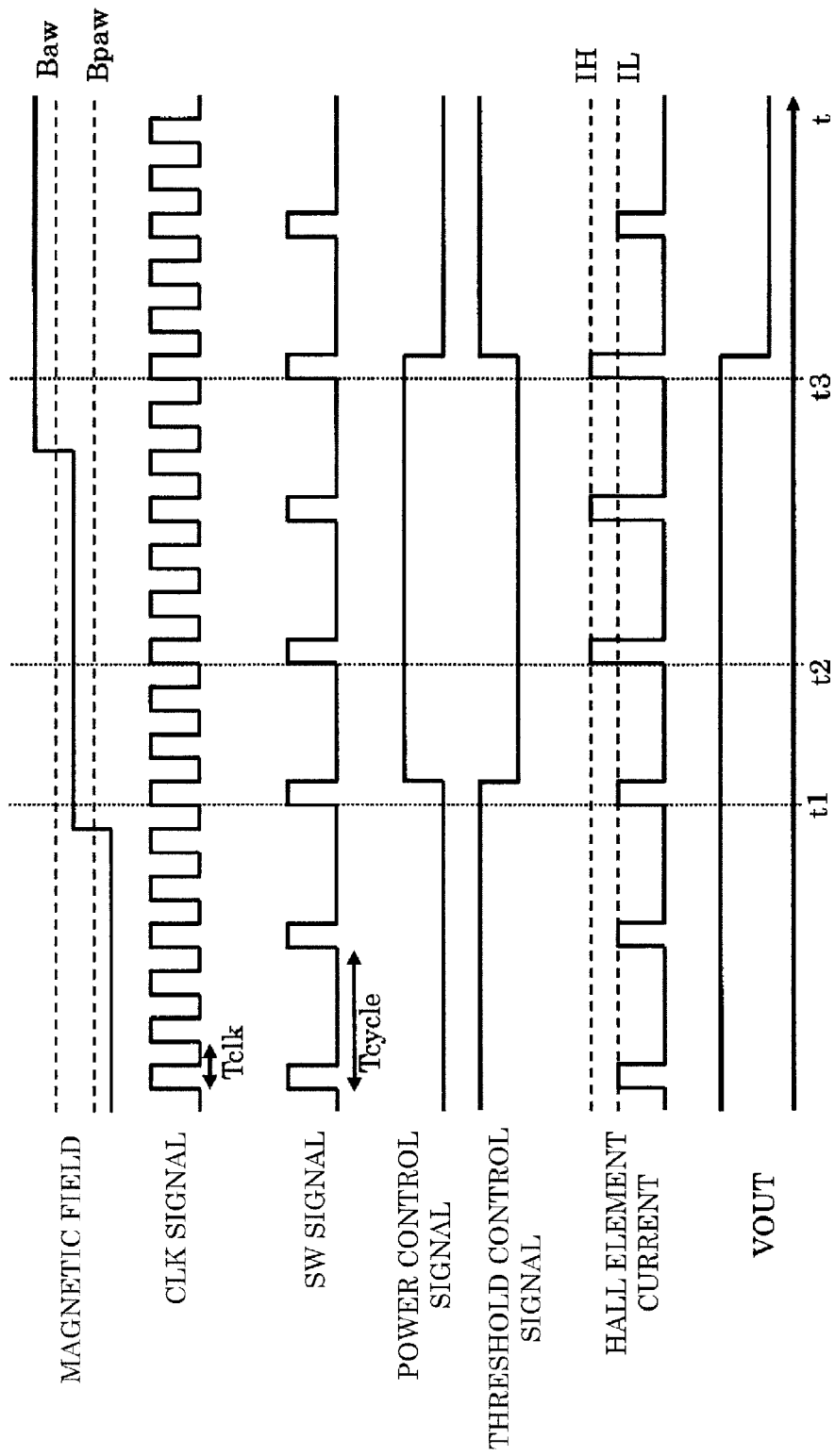
FIG. 3 is a timing chart illustrating a first operational example of the magnetic sensor device of the present embodiment.

A description will next be made about operations of the magnetic sensor device of the present embodiment. FIG. 3 is a timing chart illustrating a first operational example of the magnetic sensor device of the present embodiment.

The CLK circuit 108 generates a clock signal of which the cycle is taken to be a fixed cycle Tclk, and outputs it to the input terminal 122 of the logic circuit 120. The logic circuit 120 divides the clock signal to generate an SW signal of which the cycle is taken to be a fixed cycle Tcycle, and outputs it to the switch changeover circuit 110. With the time when the SW signal is, for example, H being taken to be a first state, the switch changeover circuit 110 turns on all of the switch circuits 111, 112, 113, and 114. With the time when the SW signal is, for example, L being taken to be a second state, the switch changeover circuit 110 turns off all of the switch circuits 111, 112, 113, and 114 to bring the first and second input terminals of the differential amplifier circuit 105 to floating. Thus, the Hall element 104 detects a magnetic field in the first state. In the second state, the Hall element 104 is stopped from operating, thereby allowing the magnetic sensor device to be intermittently operated.

The driving circuit 140 applies a voltage to the Hall element 104 through the switch circuit 111. When the Hall element 104 detects a magnetic field not greater than Bpaw, the logic circuit 120 outputs L to the input terminal 142 of the driving circuit 140 as a power control signal, and outputs H to the switch circuit 107 as a threshold control signal. The NMOS transistor 206 is turned off by the power control signal, so that a voltage VL is outputted from the output terminal 141 of the driving circuit 140. The resistors 131, 132, and 133, and the switch circuit 107 are operated as a threshold voltage generating circuit. The switch circuit 107 is turned on by the threshold control signal to generate a threshold voltage Vpaw at the second non-inversion input terminal of the comparison circuit 106.

Assuming that the resistance value between the terminals of the Hall element 104 is Rh when the voltage VL is applied from the driving circuit 140, a Hall element current flowing between one terminals of the Hall element 104 is represented as IL=VL/Rh. Assuming that the magnetic field of the Hall element is Bin, and a conversion coefficient is Kh, a difference Vs in potential between the other terminals thereof is represented as Vs=Kh×IL×Bin=Kh×VL×Bin/Rh. The differential amplifier circuit 105 converts the difference Vs in potential between the terminals of the Hall element 104 to a potential difference Vh and outputs it to the comparison circuit 106. The comparison circuit 106 compares the potential difference Vh, the threshold voltage Vpaw, and the voltage of the ground terminal 100 and outputs a signal to the input terminal 121 of the logic circuit 120. In response to the signal, the logic circuit 120 outputs H to the output terminal 103 as illustrated in FIG. 3. Incidentally, the magnetic field is detected only in the first state, and the output terminal 103 is allowed to maintain the same signal as the immediately preceding signal in the second state.

Assuming that the magnitude of the magnetic field detected in the first state indicated at t1 of FIG. 3 is Bing when the magnetic field becomes larger than Bpaw and not greater than Baw, a difference Vs2 in potential between the terminals of the Hall element 104 is represented as Vs2=Kh×IL×Bin2=Kh×VL×Bin2/Rh. The differential amplifier circuit 105 converts the potential difference Vs2 between the terminals of the Hall element 104 to a potential difference Vh2 and outputs it to the comparison circuit 106. The comparison circuit 106 compares the potential difference Vh2, the threshold voltage Vpaw, and the voltage of the ground terminal and outputs a signal to the input terminal 121 of the logic circuit 120. In response to the signal, the logic circuit 120 outputs H as for the power control signal and L as for the threshold control signal, and outputs H to the output terminal 103 as illustrated in FIG. 3. Then, the NMOS transistor 206 is turned on to generate a voltage VH (VH>VL) at the output terminal 141 of the driving circuit 140. Further, the switch circuit 107 is turned off to generate a threshold voltage Vaw at the second non-inversion input terminal of the comparison circuit 106.

In the first state indicated at t2 of FIG. 3, a difference Vs3 in potential between the terminals of the Hall element 104 is represented as Vs3=Kh×IH×Bin2=Kh×VH×Bin2/Rh. Further, a Hall element current flowing between the other terminals of the Hall element 104 is represented as IH=VH/Rh, and the accuracy of detecting the magnetic field by the Hall element 104 can be improved. The differential amplifier circuit 105 converts the potential difference Vs3 between the terminals of the Hall element 104 to a potential difference Vh3 and outputs it to the comparison circuit 106. The comparison circuit 106 compares the potential difference Vh3, the threshold voltage Vaw, and the voltage of the ground terminal and outputs a signal to the input terminal 121 of the logic circuit 120. In response to the signal, the logic circuit 120 outputs H as for the power control signal and L as for the threshold control signal, and outputs H to the output terminal 103 as illustrated in FIG. 3.

Assuming that the magnitude of the magnetic field detected in the first state indicated at t3 of FIG. 3 is Bin3 when the magnetic field becomes larger than Baw, a difference Vs4 in potential between the terminals of the Hall element 104 is represented as Vs4=Kh×IH×Bin3=Kh×VH×Bin3/Rh. The differential amplifier circuit 105 converts the potential difference Vs4 between the terminals of the Hall element 104 to a potential difference Vh4 and outputs it to the comparison circuit 106. The comparison circuit 106 compares the potential difference Vh4, the threshold voltage Vaw, and the voltage of the ground terminal 100 and outputs a signal to the input terminal 121 of the logic circuit 120. In response to the signal, the logic circuit 120 outputs L as for the power control signal and H as for the threshold control signal, and outputs L to the output terminal 103 as illustrated in FIG. 3. Then, the NMOS transistor 206 is turned off to generate a voltage VL at the output terminal 141 of the driving circuit 140. Further, the switch circuit 107 is turned on to generate a threshold voltage Vpaw at the second non-inversion input terminal of the comparison circuit 106. Thus, at t3 and subsequently, the current flowing through the Hall element 104 is reduced, thus enabling a reduction in current consumption.

As described above, the current made to flow through Hall element 104 is made small when the magnetic field is very smaller than Baw. Further, when the magnetic field becomes close to Baw and exceeds Bpaw, the current made to flow through the Hall element 104 is increased to improve the accuracy of detecting the magnetic field by the Hall element 104. Furthermore, when the magnetic field exceeds Baw and the output terminal 103 becomes L, the current made to flow through the Hall element 104 is reduced. Thus, the magnetic sensor device of the present embodiment is capable of reducing current consumption.

Figure 4:
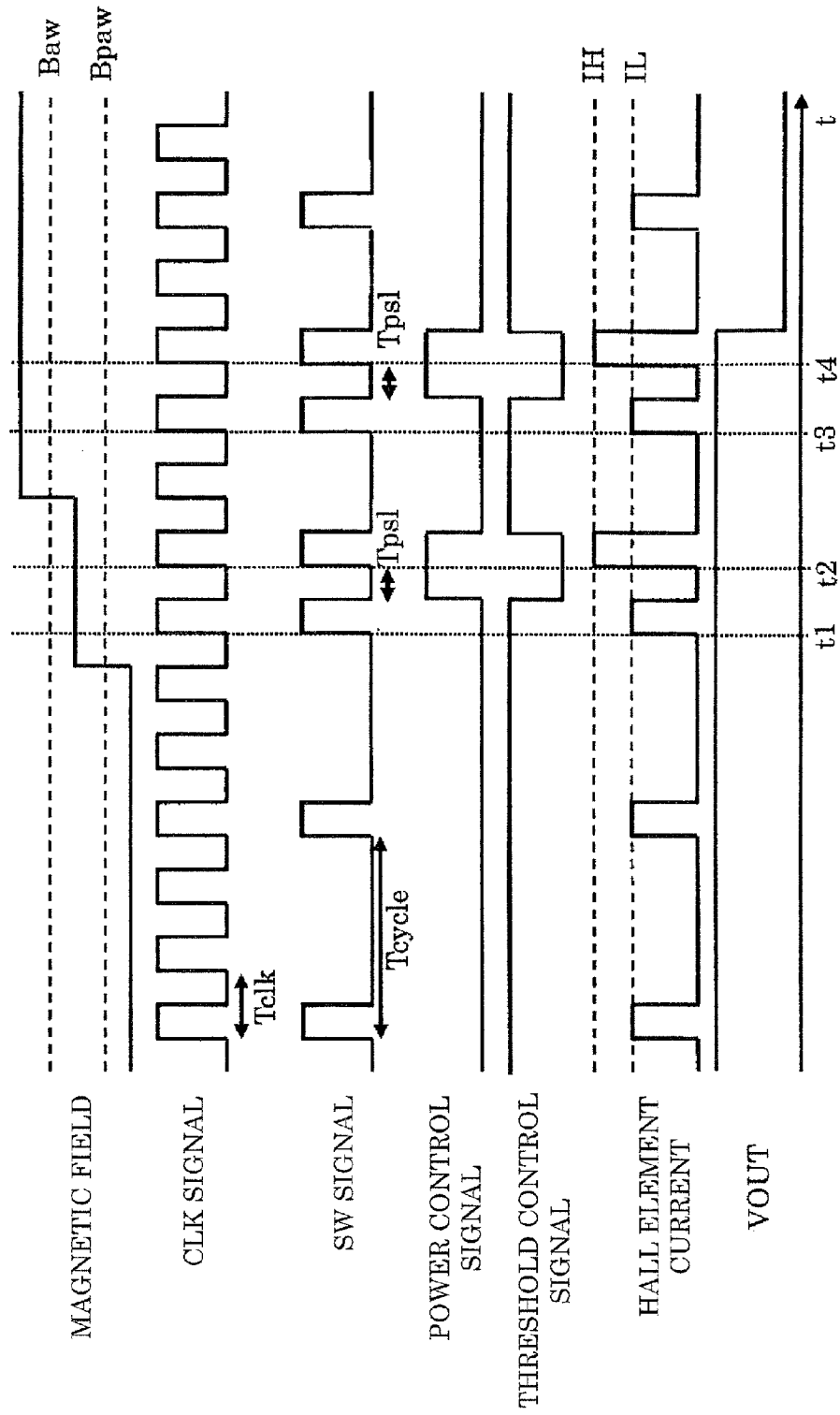
FIG. 4 is a timing chart illustrating a second operational example of the magnetic sensor device of the present embodiment.

FIG. 4 is a timing chart illustrating a second operational example of the magnetic sensor device of the present embodiment.

The CLK circuit 108 generates a clock signal of which the cycle is taken to be a fixed cycle Tclk, and outputs it to the input terminal 122 of the logic circuit 120. The logic circuit 120 divides the clock signal to generate an SW signal of which the cycle is taken to be a fixed cycle Tcycle, and outputs it to the switch changeover circuit 110. With the time when the SW signal is, for example, H being taken to be a first state, the switch changeover circuit 110 turns on all of the switch circuits 111, 112, 113, and 114. With the time when the SW signal is, for example, L being taken to be a second state, the switch changeover circuit 110 turns off all of the switch circuits 111, 112, 113, and 114 to bring the first and second input terminals of the differential amplifier circuit 105 to floating. Thus, the Hall element 104 detects a magnetic field in the first state. In the second state, the Hall element 104 is stopped from operating, thereby allowing the magnetic sensor device to be intermittently operated.

The driving circuit 140 applies a voltage to the Hall element 104 through the switch circuit 111. When the Hall element 104 detects a magnetic field not greater than Bpaw, the logic circuit 120 outputs L to the input terminal 142 of the driving circuit 140 as a power control signal and outputs H to the switch circuit 107 as a threshold control signal. The NMOS transistor 206 is turned off by the power control signal, so that a voltage VL is outputted from the output terminal 141 of the driving circuit 140. The resistors 131, 132, and 133, and the switch circuit 107 are operated as a threshold voltage generating circuit. The switch circuit 107 is turned on by the threshold control signal to generate a threshold voltage Vpaw at the second non-inversion input terminal of the comparison circuit 106.

Assuming that the resistance value between the terminals of the Hall element 104 is Rh when the voltage VL is applied from the driving circuit 140, a Hall element current flowing between one terminals of the Hall element 104 is represented as IL=VL/Rh. Assuming that the magnetic field of the Hall element is Bin, and a conversion coefficient is Kh, a difference Vs in potential between the other terminals thereof is represented as Vs=Kh×IL×Bin=Kh×VL×Bin/Rh. The differential amplifier circuit 105 converts the difference Vs in potential between the terminals of the Hall element 104 to a potential difference Vh and outputs it to the comparison circuit 106. The comparison circuit 106 compares the potential difference Vh, the threshold voltage Vpaw, and the voltage of the ground terminal 100 and outputs a signal to the input terminal 121 of the logic circuit 120. In response to the signal, the logic circuit 120 outputs H to the output terminal 103 as illustrated in FIG. 4. Incidentally, the magnetic field is detected only in the first state, and the output terminal 103 is allowed to maintain the same signal as the immediately preceding signal in the second state.

Assuming that the magnitude of the magnetic field detected in the first state indicated at t1 of FIG. 4 is Bin2 when the magnetic field becomes larger than Bpaw and not greater than Baw, a difference Vs2 in potential between the terminals of the Hall element 104 is represented as Vs2=Kh×IL×Bin2=Kh×VL×Bin2/Rh. The differential amplifier circuit 105 converts the potential difference Vs2 between the terminals of the Hall element 104 to a potential difference Vh2 and outputs it to the comparison circuit 106. The comparison circuit 106 compares the potential difference Vh2, the threshold voltage Vpaw, and the voltage of the ground terminal 100 and outputs a signal to the input terminal 121 of the logic circuit 120. In response to the signal, the logic circuit 120 outputs H as for the power control signal and L as for the threshold control signal, and outputs H to the output terminal 103 as illustrated in FIG. 4. Then, the NMOS transistor 206 is turned on to generate a voltage VH (VH>VL) at the output terminal 141 of the driving circuit 140. Further, the switch circuit 107 is turned off to generate a threshold voltage Vaw at the second non-inversion input terminal of the comparison circuit 106. Then, at t2 after the elapse of a time Tpsl (Tpsl<Tcycle) from the first state, the logic circuit 120 brings the SW signal to H to allow the Hall element 104 to detect a magnetic field in a state in which the voltage VH has been outputted from the driving circuit 140.

In the first state indicated at t2 of FIG. 4, a difference Vs3 in potential between the terminals of the Hall element 104 is represented as Vs3=Kh×IH×Bin2=Kh×VH×Bin2/Rh. Further, a Hall element current flowing between the other terminals of the Hall element 104 is represented as IH=VH/Rh, and the accuracy of detecting the magnetic field by the Hall element 104 can be improved. The differential amplifier circuit 105 converts the potential difference Vs3 between the terminals of the Hall element 104 to a potential difference Vh3 and outputs it to the comparison circuit 106. The comparison circuit 106 compares the potential difference Vh3, the threshold voltage Vaw, and the voltage of the ground terminal and outputs a signal to the input terminal 121 of the logic circuit 120. In response to the signal, the logic circuit 120 outputs L as for the power control signal and H as for the threshold control signal, and outputs H to the output terminal 103 as illustrated in FIG. 4. Then, after the elapse of a time Tcycle from t1, the logic circuit 120 brings the SW signal to H and detects the magnetic field in like manner. Thus, after the magnetic field has been detected at t2 in the state in which the accuracy has been improved, the current flowing through the Hall element 104 can be reduced in consumption.

Assuming that the magnitude of the magnetic field detected in the first state indicated at t3 of FIG. 4 is Bin3 when the magnetic field becomes larger than Baw, a difference Vs4 in potential between the terminals of the Hall element 104 is represented as Vs4=Kh×IL×Bin3=Kh×VL×Bin3/Rh. The differential amplifier circuit 105 converts the potential difference Vs4 between the terminals of the Hall element 104 to a potential difference Vh4 and outputs it to the comparison circuit 106. The comparison circuit 106 compares the potential difference Vh4, the threshold voltage Vpaw, and the voltage of the ground terminal and outputs a signal to the input terminal 121 of the logic circuit 120. In response to the signal, the logic circuit 120 outputs H as for the power control signal and L as for the threshold control signal, and outputs H to the output terminal 103 as illustrated in FIG. 4. Then, the NMOS transistor 206 is turned on to generate a voltage VH (VH>VL) at the output terminal 141 of the driving circuit 140. Further, the switch circuit 107 is turned off to generate a threshold voltage Vaw at the second non-inversion input terminal of the comparison circuit 106. Then, at t4 after the elapse of the time Tpsl (Tpsl<Tcycle) from the first state indicated at t3, the logic circuit 120 brings the SW signal to H to allow the Hall element 104 to detect a magnetic field in a state in which the voltage VH has been outputted from the driving circuit 140.

In the first state indicated at t4 of FIG. 4, a difference Vs5 in potential between the terminals of the Hall element 104 is represented as Vs5=Kh×IH×Bin3=Kh×VH×Bin3/Rh. The differential amplifier circuit 105 converts the potential difference Vs5 between the terminals of the Hall element 104 to a potential difference Vh5 and outputs it to the comparison circuit 106. The comparison circuit 106 compares the potential difference Vh5, the threshold voltage Vaw, and the voltage of the ground terminal 100 and outputs a signal to the input terminal 121 of the logic circuit 120. In response to the signal, the logic circuit 120 outputs L as for the power control signal and H as for the threshold control signal, and outputs L to the output terminal 103 as illustrated in FIG. 4. Then, the NMOS transistor 206 is turned off to generate a voltage VL at the output terminal 141 of the driving circuit 140. Further, the switch circuit 107 is turned on to generate a threshold voltage Vpaw at the second non-inversion input terminal of the comparison circuit 106. Thus, at t4 and subsequently, the current flowing through the Hall element 104 is reduced, and the magnetic sensor device of the present embodiment can hence be lowered in current consumption.

Thus, the current made to flow through Hall element 104 is made small when the magnetic field is very smaller than Baw. When the magnetic field becomes close to Baw, the current made to flow through the Hall element 104 is increased only when detecting that the magnetic field has become close to Baw to thereby improve the accuracy of detecting the magnetic field by the Hall element 104. Then, when the magnetic field exceeds Baw and the output terminal 103 becomes L, the current made to flow through the Hall element 104 is reduced to enable low current consumption.

Further, although the operation of the magnetic sensor device has been described with Tpsl as a finite time in the present embodiment, Tpsl may be taken to be equal to zero.

Figure 5:
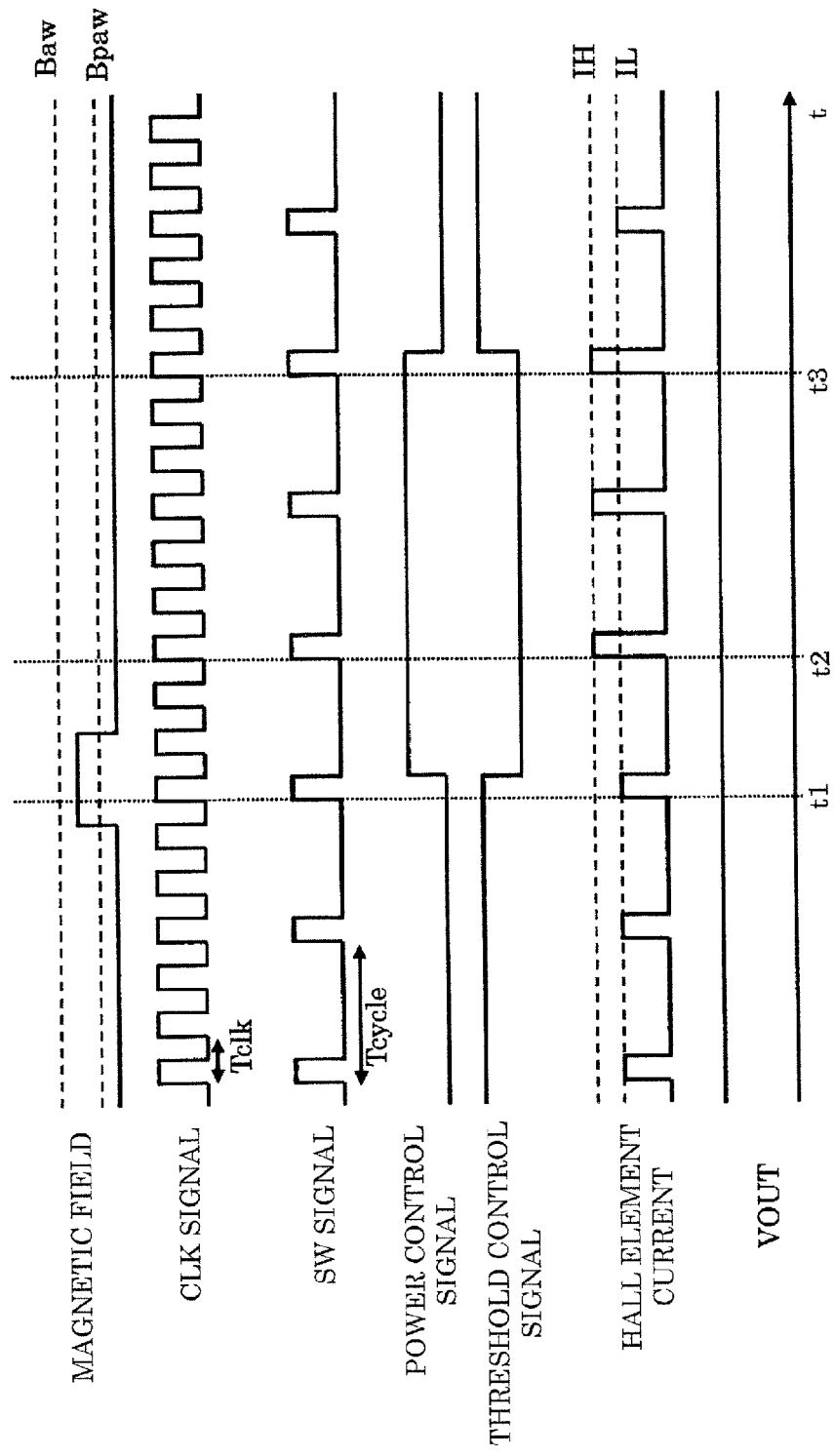
FIG. 5 is a timing chart illustrating a third operational example of the magnetic sensor device of the present embodiment.

FIG. 5 is a timing chart illustrating a third operational example of the magnetic sensor device of the present embodiment.

The CLK circuit 108 generates a clock signal of which the cycle is taken to be a fixed cycle Tclk, and outputs it to the input terminal 122 of the logic circuit 120. The logic circuit 120 divides the clock signal to generate an SW signal of which the cycle is taken to be a fixed cycle Tcycle, and outputs it to the switch changeover circuit 110. With the time when the SW signal is, for example, H being taken to be a first state, the switch changeover circuit 110 turns on all of the switch circuits 111, 112, 113, and 114. With the time when the SW signal is, for example, L being taken to be a second state, the switch changeover circuit 110 turns off all of the switch circuits 111, 112, 113, and 114 to bring the first and second input terminals of the differential amplifier circuit 105 to floating. Thus, the Hall element 104 detects a magnetic field in the first state. In the second state, the Hall element 104 is stopped from operating, thereby allowing the magnetic sensor device to be intermittently operated.

The driving circuit 140 applies a voltage to the Hall element 104 through the switch circuit 111. When the Hall element 104 detects a magnetic field not greater than Bpaw, the logic circuit 120 outputs L to the input terminal 142 of the driving circuit 140 as a power control signal and outputs H to the switch circuit 107 as a threshold control signal. The NMOS transistor 206 is turned off by the power control signal, so that a voltage VL is outputted from the output terminal 141 of the driving circuit 140. The resistors 131, 132, and 133, and the switch circuit 107 are operated as a threshold voltage generating circuit. The switch circuit 107 is turned on by the threshold control signal to generate a threshold voltage Vpaw at the second non-inversion input terminal of the comparison circuit 106.

Assuming that the resistance value between the terminals of the Hall element 104 is Rh when the voltage VL is applied from the driving circuit 140, a Hall element current flowing between one terminals of the Hall element 104 is represented as IL=VL/Rh. Assuming that the magnetic field of the Hall element is Bin, and a conversion coefficient is Kh, a difference Vs in potential between the other terminals thereof is represented as Vs=Kh×IL×Bin=Kh×VL×Bin/Rh. The differential amplifier circuit 105 converts the difference Vs in potential between the terminals of the Hall element 104 to a potential difference Vh and outputs it to the comparison circuit 106. The comparison circuit 106 compares the potential difference Vh, the threshold voltage Vpaw, and the voltage of the ground terminal 100 and outputs a signal to the input terminal 121 of the logic circuit 120. In response to the signal, the logic circuit 120 outputs H to the output terminal 103 as illustrated in FIG. 5. Incidentally, the magnetic field is detected only in the first state, and the output terminal 103 is allowed to maintain the same signal as the immediately preceding signal in the second state.

Assuming that the magnitude of the magnetic field detected in the first state indicated at t1 of FIG. 5 is Bin2 when the magnetic field becomes larger than Bpaw and not greater than Baw, a difference Vs2 in potential between the terminals of the Hall element 104 is represented as Vs2=Kh×IL×Bin2=Kh×VL×Bin2/Rh. The differential amplifier circuit 105 converts the potential difference Vs2 between the terminals of the Hall element 104 to a potential difference Vh2 and outputs it to the comparison circuit 106. The comparison circuit 106 compares the potential difference Vh2, the threshold voltage Vpaw, and the voltage of the ground terminal 100 and outputs a signal to the input terminal 121 of the logic circuit 120. In response to the signal, the logic circuit 120 outputs H as for the power control signal and L as for the threshold control signal, and outputs H to the output terminal 103 as illustrated in FIG. 5. Then, the NMOS transistor 206 is turned on to generate a voltage VH (VH>VL) at the output terminal 141 of the driving circuit 140. Further, the switch circuit 107 is turned off to generate a threshold voltage Vaw at the second non-inversion input terminal of the comparison circuit 106.

In the first state indicated at t2 of FIG. 5, a difference Vs3 in potential between the terminals of the Hall element 104 is represented as Vs3=Kh×IH×Bin2=Kh×VH×Bin2/Rh. Further, a Hall element current flowing between the other terminals of the Hall element 104 is represented as IH=VH/Rh, and the accuracy of detecting the magnetic field by the Hall element 104 can be improved. The differential amplifier circuit 105 converts the potential difference Vs3 between the terminals of the Hall element 104 to a potential difference Vh3 and outputs it to the comparison circuit 106. The comparison circuit 106 compares the potential difference Vh3, the threshold voltage Vaw, and the voltage of the ground terminal and outputs a signal to the input terminal 121 of the logic circuit 120. In response to the signal, the logic circuit 120 outputs H as for the power control signal and L as for the threshold control signal, and outputs H to the output terminal 103 as illustrated in FIG. 5.

In the first state indicated at t3 of FIG. 5, a first state in a state in which the power control signal is H continuously for N (where N=3 in the present operational example) times at t2 and subsequently is reached. At this time, the logic circuit 120 outputs L for the power control signal and H for the threshold control signal upon switching to the second state without depending on the magnitude of the detected magnetic field. Assuming that the magnitude of the magnetic field detected at this time is Bin3, a difference Vs4 in potential between the terminals of the Hall element 104 is represented as Vs4=Kh×IH×Bin3=Kh×VH×Bin3/Rh. The differential amplifier circuit 105 converts the potential difference Vs4 between the terminals of the Hall element 104 to a potential difference Vh4 and outputs it to the comparison circuit 106. The comparison circuit 106 compares the potential difference Vh4, the threshold voltage Vaw, and the voltage of the ground terminal 100 and outputs a signal to the input terminal 121 of the logic circuit 120. In response to the signal, the logic circuit 120 outputs L as for the power control signal and H as for the threshold control signal, and outputs H to the output terminal 103 as illustrated in FIG. 5. Then, the NMOS transistor 206 is turned off to generate a voltage VL at the output terminal 141 of the driving circuit 140. Further, the switch circuit 107 is turned on to generate a threshold voltage Vpaw at the second non-inversion input terminal of the comparison circuit 106. Thus, at t3 and subsequently, the current flowing through the Hall element 104 is reduced and the magnetic sensor device of the present embodiment can hence be reduced in current consumption.

Thus, when subjected to the first state at the predetermined Nth time even if once, the magnetic field becomes larger Bpaw and the current made to flow through the Hall element 104 is increased, the magnetic sensor device can be reduced in current consumption by reducing the current made to flow through the Hall element 104 again.

Further, although the operation of the magnetic sensor device has been described with N=3 in the present embodiment, N may be an integer greater than or equal to 2.

Figure 6:
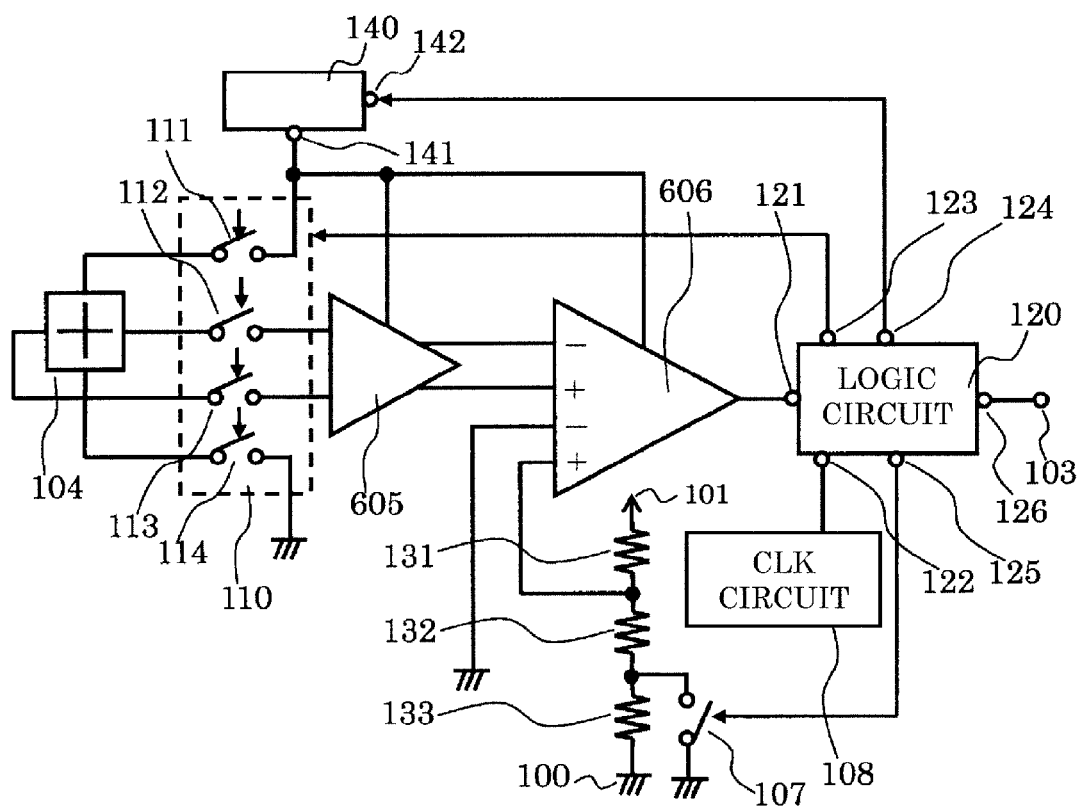
FIG. 6 is a circuit diagram illustrating another example of the magnetic sensor device of the present embodiment.
Figure 7:
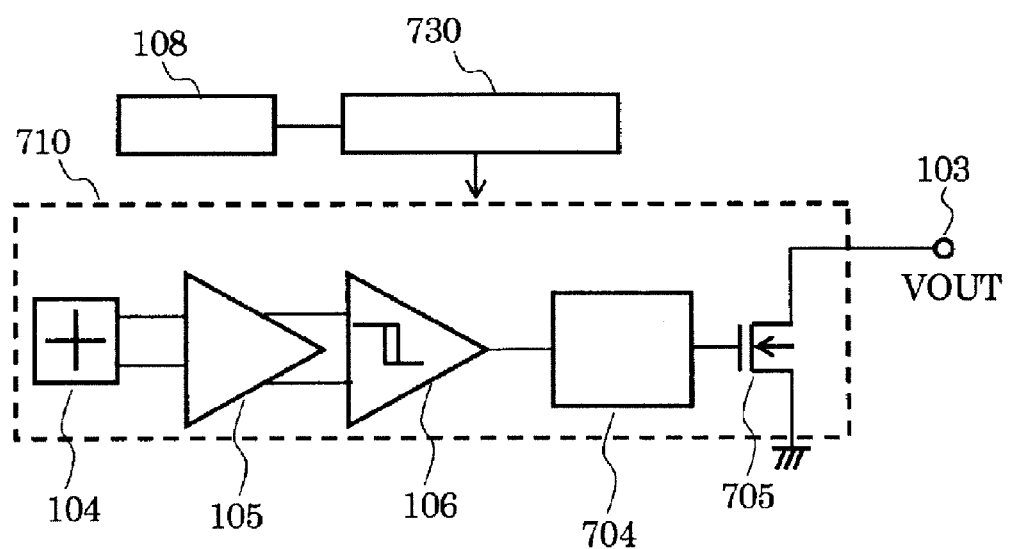
FIG. 7 is a circuit diagram of the related art magnetic sensor device.
Figure 8:
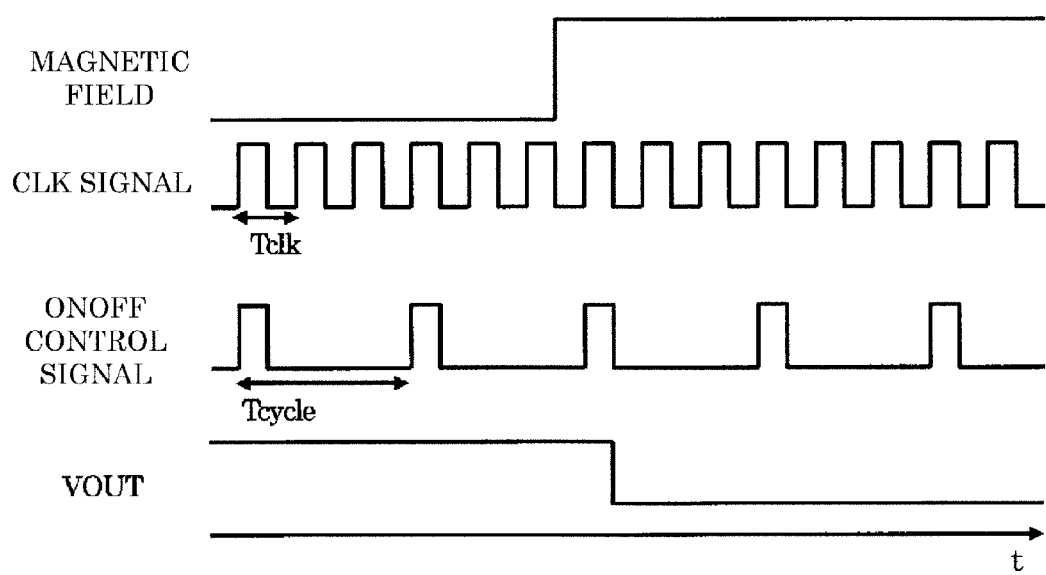
FIG. 8 is a timing chart of the related art magnetic sensor device.

FIG. 6 is a circuit diagram illustrating another example of the magnetic sensor device of the present embodiment.

The magnetic sensor device may be configured in such a manner that power supply input terminals of a differential amplifier circuit 605 and a comparison circuit 606 are connected to an output terminal 141 of a driving circuit 140, and a power supply voltage is applied thereto through the driving circuit 140.

If configured in this way, when the magnetic field is very smaller than Baw, it is possible to reduce a current made to flow through the differential amplifier circuit 605 and the comparison circuit 606 and further attain low current consumption.

Incidentally, although the present embodiment has been described using the Hall element, a physical quantity may be detected using a conversion element which provides a voltage output similarly in proportion to a physical quantity such as acceleration or pressure, and drive power.

As described above, the magnetic sensor device of the present embodiment is capable of by switching the drive power of the Hall element, reducing current consumption when the magnetic field is smaller than the magnetic field desired to detect, and improving the accuracy of detecting the magnetic field by the Hall element only when the magnetic field is close to the magnetic field desired to detect, thereby enhancing the accuracy of the magnetic sensor device.

What is claimed is:

1. A magnetic sensor device which provides a logic output according to the intensity of a magnetic field applied to a sensor element, comprising:
    a driving circuit which supplies power to the sensor element;
    a switch changeover circuit which restricts the supply of the power from the driving circuit to the sensor element;
    a differential amplifier circuit which performs arithmetic processing on an output signal of the sensor element;
    a threshold voltage generating circuit which generates a threshold voltage used in magnetism determination;
    a comparison circuit which compares and determines a voltage outputted from the differential amplifier circuit and the threshold voltage; and
    a logic circuit which outputs a first signal to change the power supplied to the sensor element by the driving circuit according to the output of the comparison circuit, a second signal to switch the threshold voltage of the threshold voltage generating circuit according to the output of the comparison circuit, and a third signal to control on/off of the switch changeover circuit in a constant cycle.

2. The magnetic sensor device according to claim 1, wherein when the logic circuit detects from the output of the comparison circuit that the magnetic field intensity has approached a predetermined magnetic field intensity, the logic circuit outputs the first signal to increase the power supplied to the sensor element from the driving circuit, and outputs the second signal to increase the threshold voltage of the threshold voltage generating circuit, thereby improving accuracy of detecting the magnetic field intensity by the sensor element.

3. The magnetic sensor device according to claim 2, wherein when the third signal is switched n times (where n is an integer greater than or equal to 2) in a state in which the driving circuit increases the power supplied to the sensor element, the logic circuit outputs the first signal to lower the power supplied to the sensor element from the driving circuit, and outputs the second signal to lower the threshold voltage of the threshold voltage generating circuit, thereby reducing power consumption of the sensor element.

4. The magnetic sensor device according to claim 1, wherein when the logic circuit detects from the output of the comparison circuit that the magnetic field intensity has approached a predetermined magnetic field intensity, the logic circuit outputs the first signal to increase the power supplied to the sensor element from the driving circuit, outputs the second signal to increase the threshold voltage of the threshold voltage generating circuit, and outputs the third signal before the next cycle is reached to improve accuracy of detecting the magnetic field intensity by the sensor element.

5. The magnetic sensor device according to claim 1, wherein the differential amplifier circuit is driven by power supplied from the driving circuit.

6. The magnetic sensor device according to claim 1, wherein the comparison circuit is driven by power supplied from the driving circuit.

* * * * *